(12) United States Patent
Pan

(10) Patent No.: US 7,903,014 B1
(45) Date of Patent: Mar. 8, 2011

(54) TECHNIQUES TO IMPROVE DIFFERENTIAL NON-LINEARITY IN R-2R CIRCUITS

(75) Inventor: Feng Pan, Fremont, CA (US)

(73) Assignee: SanDisk Corporation, Milpitas, CA (US)

(*) Notice: Subject to any disclaimer, the term of this patent is extended or adjusted under 35 U.S.C. 154(b) by 0 days.

(21) Appl. No.: 12/645,200

(22) Filed: Dec. 22, 2009

(51) Int. Cl.
*H03M 1/66* (2006.01)

(52) U.S. Cl. .............................. 341/144; 331/9
(58) Field of Classification Search ........... 341/144–170
See application file for complete search history.

(56) References Cited

U.S. PATENT DOCUMENTS

| | | | |
|---|---|---|---|
| 6,198,266 B1 * | 3/2001 | Mercer | 323/316 |
| 6,218,822 B1 * | 4/2001 | MacQuigg | 323/313 |
| 6,329,804 B1 * | 12/2001 | Mercer | 323/315 |
| 7,468,215 B2 * | 12/2008 | Nielsen et al. | 429/415 |

* cited by examiner

*Primary Examiner* — Lam T Mai
(74) *Attorney, Agent, or Firm* — Davis Wrright Tremaine LLP

(57) ABSTRACT

A circuit and corresponding method are presented for generating an analog voltage from a digital input value is presented. An digital to analog conversion circuit, which is connected between a node and ground, receives an N-bit digital input value and generate from it a corresponding analog voltage. The node receives an input voltage provided by an op-amp connected to receive a reference voltage. The circuit also includes a variable resistance connected between the first node and ground in parallel with the digital to analog conversion circuit. The variable resistance is also connected to receive one or more of the digital input value and the value of the variable resistance is dependent upon the digital input values such that the combined current drawn from the first node by the variable resistance and the digital to analog conversion circuit is essentially constant during operation.

12 Claims, 6 Drawing Sheets

$V_{out} = a*(V_{in} - b*V_{out})$

TECHNIQUES TO IMPROVE DIFFERENTIAL NON-LINEARITY IN R-2R CIRCUITS

FIELD OF THE INVENTION

This invention pertains generally to the field of circuits for digital-to-analog conversion and, more particularly, to reducing of differential non-linearity in R-2R circuits.

BACKGROUND

An R-2R circuit is a simple and inexpensive way to perform digital-to-analog conversion that typically uses arrangements of precision resistor networks in a ladder-like configuration. FIG. 1A shows a basic R-2R resistor ladder for an N-bit digital to analog conversion, where a0-a(N−1) are the N bits from the least to the most significant, are converted to a corresponding analog value at the output. To effect a conversion, the bits are switched between ground ("0") and Vref ("1") based on the N digital input for the $2^N$ possible output values. FIGS. 1b and 1c show variations, respectively in 3 bit and 6 bit variations.

Although the sort of R-2R ladder shown in FIG. 1a is inexpensive and relatively easy to manufacture, since only two resistor values are required, it is subject to inaccuracies such as differential non-linearity. The R-2R ladder operates as a string of current dividers whose output accuracy is dependent on how well each resistor is matched to the others. Small inaccuracies in the more significant bits' resistors can overwhelm the contribution of the less significant bits, resulting in particularly non-linear differential behavior at major crossings, such as from 01111 . . . to 10000 . . . . This can limit the accuracy and usefulness of such circuits for DAC conversion involving high numbers of bits. Referring back to FIG. 1a, at such a transition, although the value may only change by one, the values of all or almost all bits are flipped. This effect is illustrated schematically in FIGS. 2a and 2b, where the higher bit transitions, such as at 511 (where a9 switches from 0 to 1) or 255 (where a8 switches), typically result in a non-linear incremental increase. Depending on the specific case these kinks in the step size can either be positive, as in FIG. 2a, or negative, as in FIG. 2b, or mixed (positive at MSB and negative at the next most significant bit, for example).

Digital to Analog Converters (DACs) based on an R-2R circuit are often employed as peripheral elements on larger circuits. One example is for supplying the various read voltages used on multi-level non-volatile memory circuits. (Examples of such non-volatile memory circuits are presented in US patent application publication number US-2008-0019188-A.) FIGS. 3a and 3b are experimental data to show the behavior of one such actual circuit over a sub-range of the digital input. As shown in FIG. 3a, a digital value along the horizontal axis is converted into an analog value (VCGRV, corresponding to a control gate read voltage value) ranging from 0V to 3V, as shown on the vertical axis. The behavior is generally increasing, but not quite linear. The non-linearity is more apparent in FIG. 3b, which shows the incremental step size plotted against the digital input value. Particularly prominent kinks occur at decimal values 108 and 236, corresponding to higher order bit transitions. Consequently, there is room for improvement in the behavior of such circuits.

SUMMARY OF THE INVENTION

A circuit for generating an analog voltage from a digital input value is presented. The circuit includes an op-amp connected to receive a reference voltage and provide an input voltage generated from the reference voltage to a first node. The circuit also includes a digital to analog conversion circuit connected between the first node and ground that receives an N-bit digital input value and generate from these an analog voltage. A variable resistance is connected between the first node and ground in parallel with the analog to digital conversion circuit and connected to receive the digital input value, where the value of the variable resistance is dependent upon digital input value such that the combined current drawn from the first node by the variable resistance and the digital to analog conversion circuit is essentially fixed during operations.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

The various aspects and features of the present invention may be better understood by examining the following figures, in which.

DETAILED DESCRIPTION

The techniques presented here are widely applicable to sort of the circuits described in the Background section below. First, the subject of differential non-linearity is considered in more detail. Such errors can variously arise from a number of sources, including resistor mismatch, layout parasitics, transistor on resistance, op-amp gain variation, and op-amp offset. The primary concern here is the R-2R Differential Non-Linearity (DNL) introduced by the variation of open loop gain of an op-amp as the current flowing through the R-2R circuit changes. As the current supplied from an op-amp to the R-2R circuit varies, the feedback error term of the op-amp due to open loop gain variation will become more of a source of error in DAC conversion. The techniques presented here treat this error by maintaining the total current sourcing from the output of the op-amp stage to be constant. A variable resistance is added to the output of the op-amp in parallel with the R-2R circuit. As the digital value input into the R-2R DAC circuit changes, the current through the variable resistance will be changed to complement the change through the R-2R element. As the total current sourcing from the op-amp's output is maintained at a constant level, the gain of the op-amp is kept uniform.

Figure 1A:
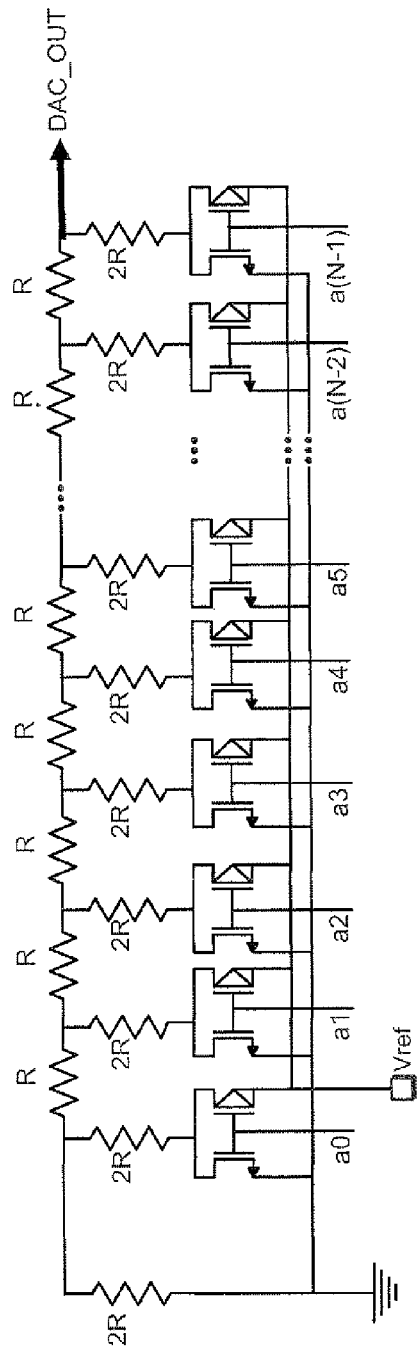
FIGS. 1a-1c show several variations of basic prior art digital to analog conversion circuits based on R-2R type circuits.
Figure 1C:
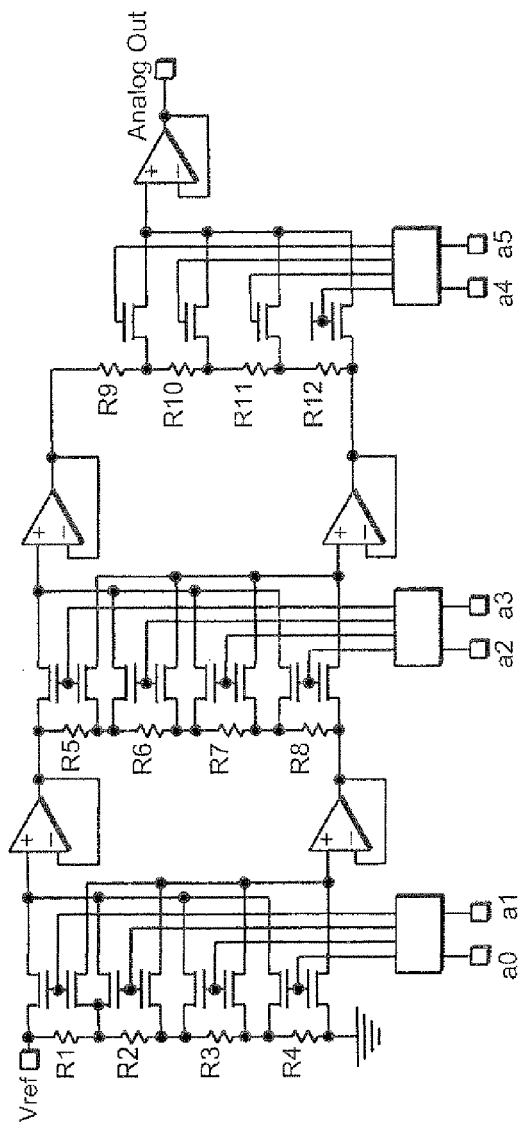
Figure 1B:
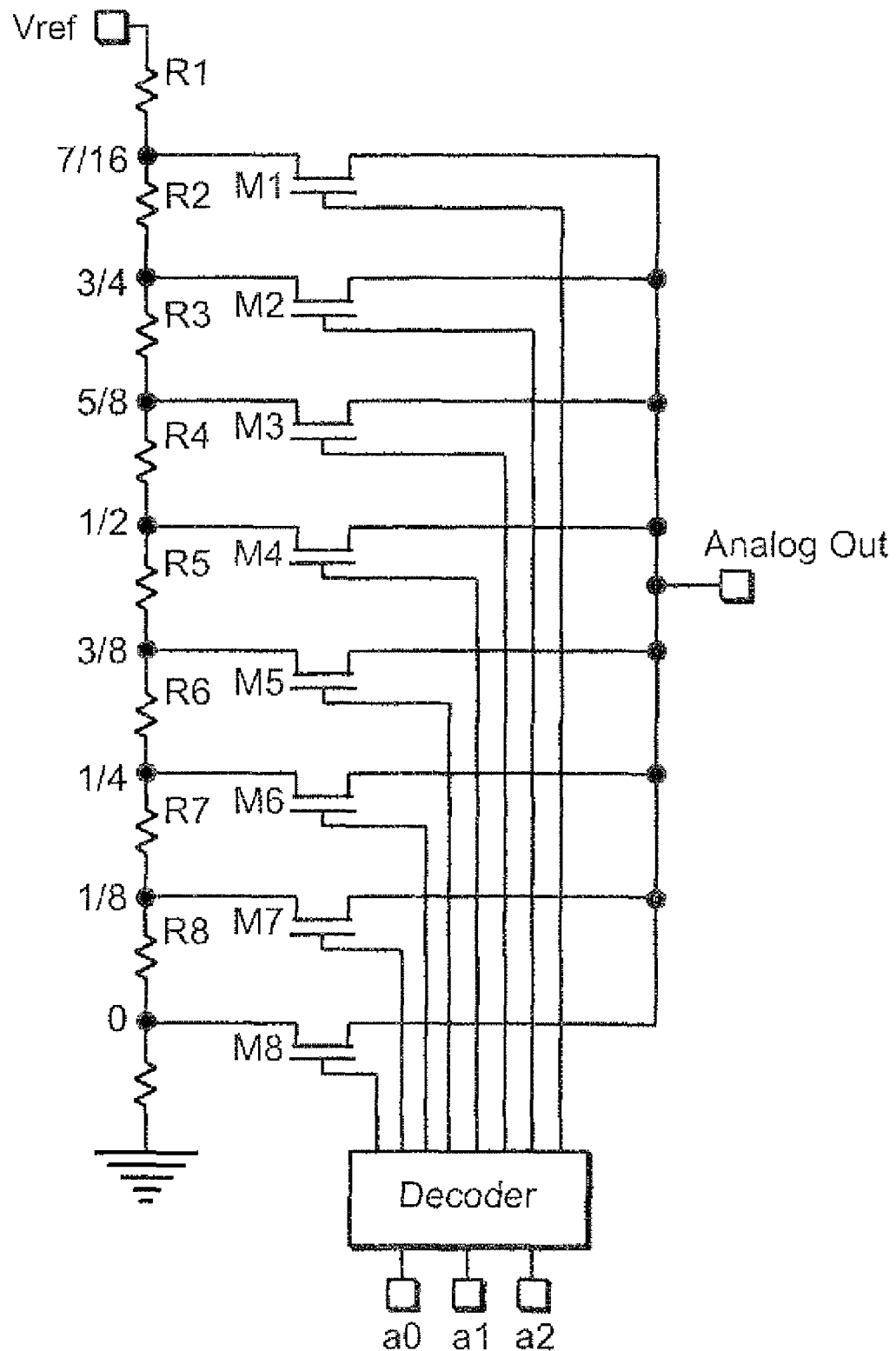
Figure 2A:
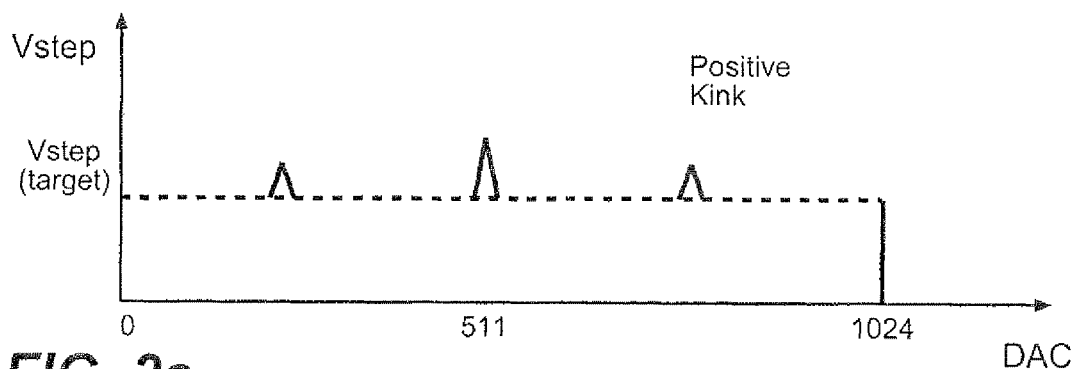
FIGS. 2a and 2b illustrate differential non-linearity in a digital to analog conversion circuit.
Figure 2B:
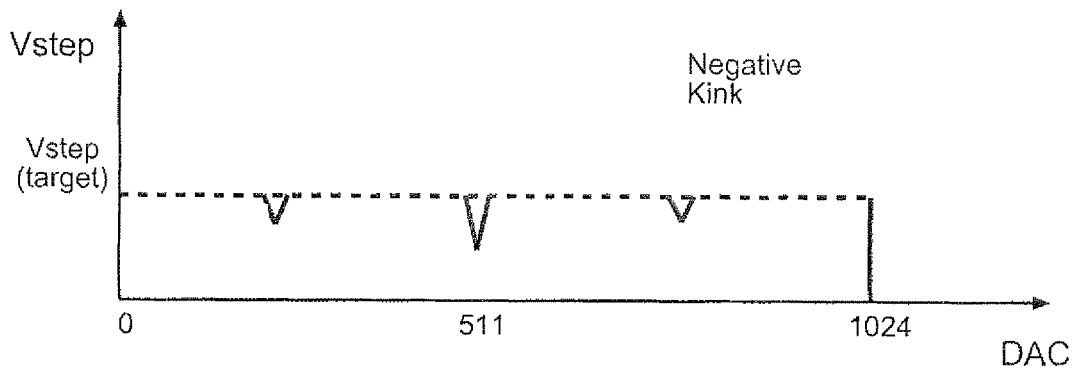
Figure 3A:
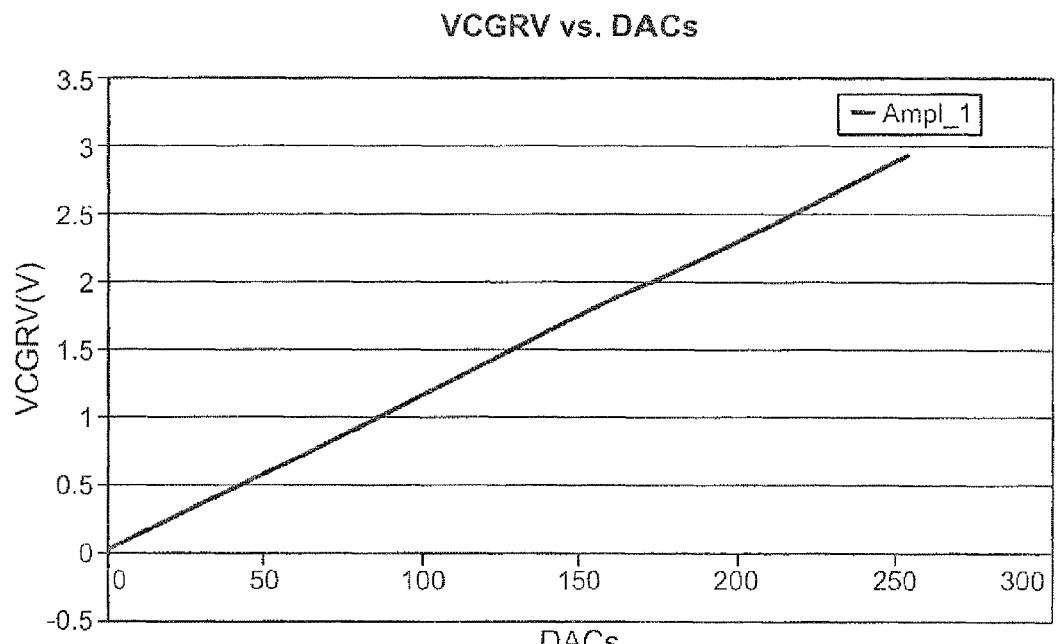
FIGS. 3a and 3b show the differentially non-linear behavior of an actual DAC R-2R circuit.
Figure 3B:
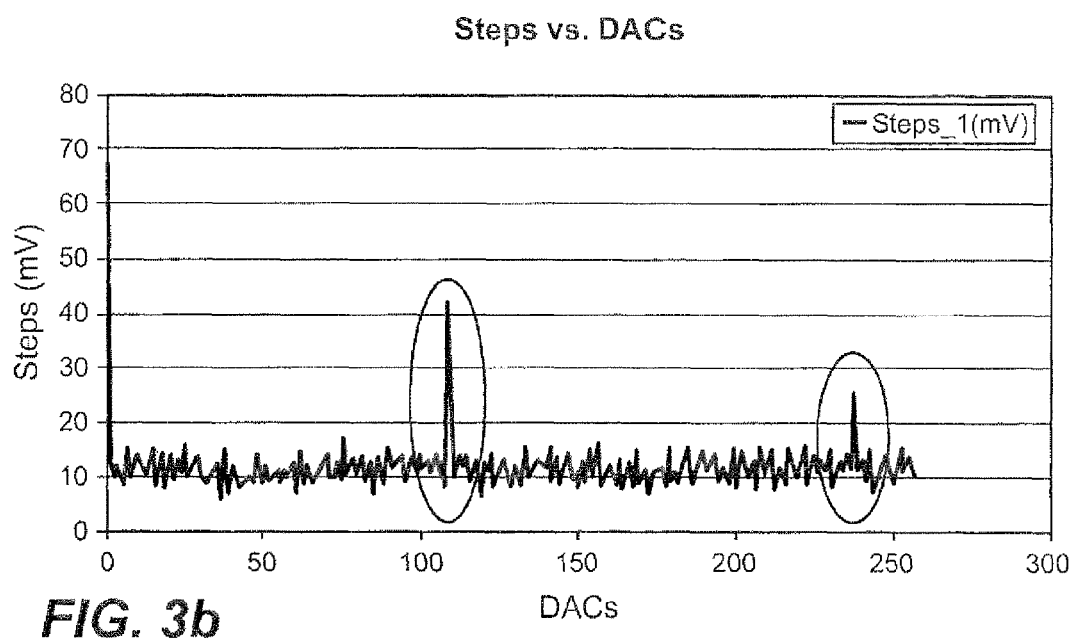
Figure 4:
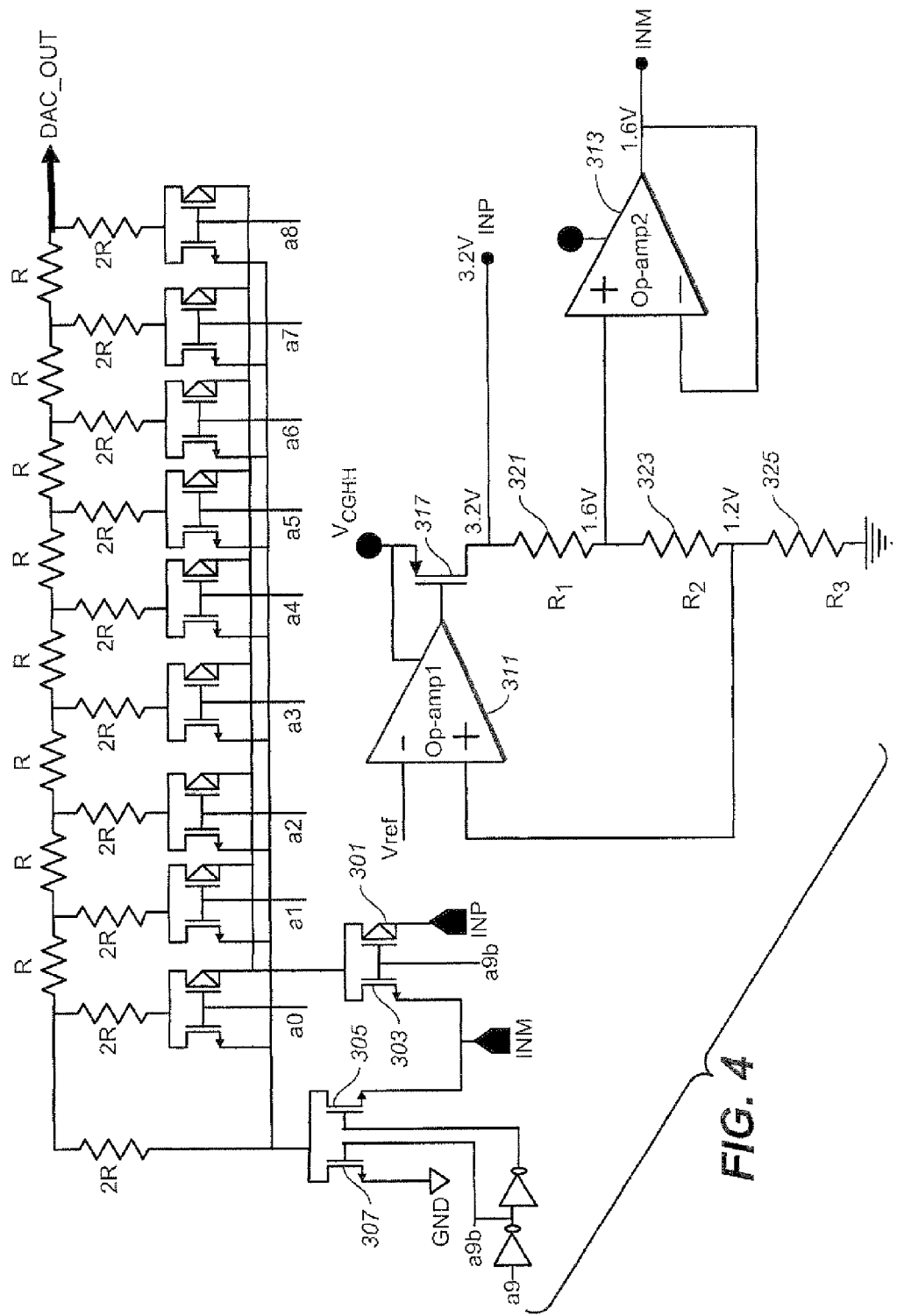
FIG. 4 shows an embodiment of an R-2R DAC circuit.

FIG. 4 shows a variation on the basic R-2R shown in FIG. 1a. The DAC in FIG. 4 is a 10-bit embodiment, with the lowest 9 bits (a0-a8) having a basic arrangement. The most significant bit, a9, is treated differently. Rather than operate the R-2R circuit using a high value (3.2V in this example) and a low value (ground), when a9=0 the (9 bit) R-2R operated between an intermediate level (here 1.6V) and ground, but when a9=1 it is operated between the high level and the intermediate level. By matching the step size across this transition, the kink across the 0111 ... to 1000 ... can be reduced. This removes what is typically the largest non-linearity. As shown as the bottom left of the R-2R circuit, when a9=0, transistor 307 takes node A to ground and transistor 303 connects node B to the intermediate voltage input. INM. When a9=1, it is instead node A that is connected to the intermediate voltage INM by transistor 305, while node B is connected to the high level input INP by transistor 301.

Some exemplary circuitry for providing the INP and INM inputs is shown in the lower portions of FIG. 4. The resistive elements R1 321, R2 323, and R3 325 are connected in series between the supply level $V_{CGHH}$ and ground. A transistor 317 is connected between the supply level and R1 321 and has its control gate connected to take the output of Op-amp1 311. The resistors are chosen so that the node between R1 321 and transistor 317 will be set at the high input value of in this example, 3.2V at the INP output, the intermediate node between R1 321 and R2 323 will be at half this value (1.6V), and feedback to the + terminal of Op-amp1 311 is taken from the node between R2 323 and R3 325, here set at 1.2V. The − terminal of Op-amp1 311 is connected to a reference voltage $V_{ref}$ generated, for example, from a bandgap reference element. The intermediate output INM is supplied by the output of Op-amp2 313, which has its + input connected to the node between R1 321 and R2 323 and whose output is also fed back to its − input.

Figure 5:
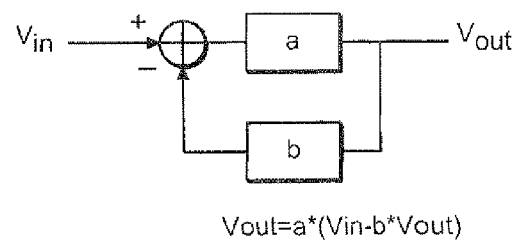
FIG. 5 illustrates an abstract op-amp for a derivation of open loop gain error.

As noted above, one of the sources of error in this arrangement is due to op-amp gain variation as the inputs to the R-2R DAC change. Op-amp close loop gain can be considered further with the abstract representation of an op-amp presented in FIG. 5. As shown there, Vout=a*(Vin-b*Vout), or Vout=(1/a+b)$^{-1}$ Vin, so that that if a is large enough, Vout is only dependent upon the feedback gain b, with the error being 1/(1+ab) so that larger open loop gain suppresses the error term.

Going back to FIG. 4, as the digital value input (a0-a9) to the DAC switches, the current load changes; and as a consequence, the resistance of the DAC circuit, $R_{R-2R}$, is changing and the open loop gain is changing. Because of the gain changes, the high input node INP will have an error term due to the gain variation. For example, if the gain changes from 60 db to 40 db, the error term introduced changes from 3.2V/10$^3$ to 3.2V/10$^2$. Similarly the value of INM generated from Op-Amp 313 will vary as a function of loading current on INM. To improve the accuracy of the level at the INP node as an example, a compensating resistor network is introduced.

Figure 6:
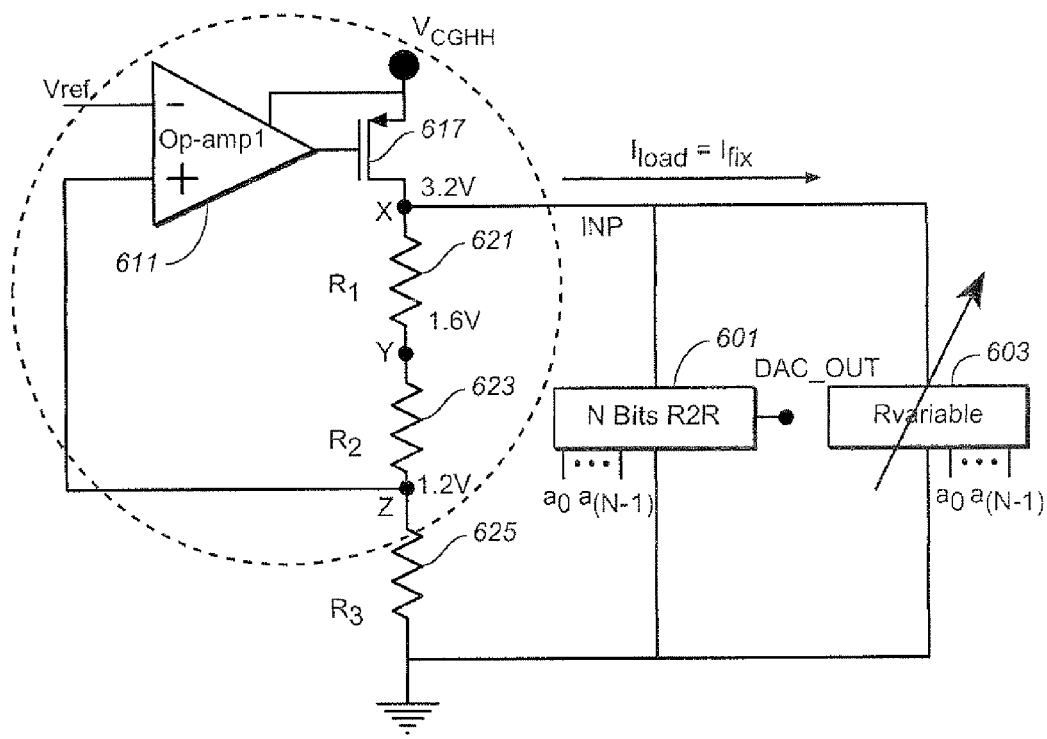
FIG. 6 illustrates an exemplary embodiment for the reduction of differential non-linearity due to gain variation of the op-amp.

FIG. 6 shows such an arrangement. The high input INP for the ADC circuit can again be generated as in FIG. 4. Transistor 617 and resistors R1 621, R2 623, and R3 625 are connected in series between the high level voltage $V_{CGHH}$ and ground, with the high input INP taken from the node X between transistor 617 and R1 621. The control gate of the transistor 617 is attached to the output of Op-amp1 611, whose − input receives the reference level Vref and whose + input receives feedback from the chain of resistances at node Z. The resistive elements can of course be arranged differently, where, for example R1 621 and R2 623 could be a single element with on node Y if there is no need for an intermediate level INM, or where, for example, the voltage divided uses capacitors instead of or in addition to resistors. As with the example of FIG. 4, the nodes X, Y, and Z are respectively taken at 3.2V, 1.6V, and 1.2V. The high input INP is supplied to an N-bit DAC circuit 601, which also connected to ground and has as inputs the N-bit digital value of a0-a(N−1), from which it generates the analog output of DAC_OUT. The DAC circuit 601 can, among other designs, be a basic R-2R circuit such as the upper portion of that shown in FIG. 4 for a0-a8 (without transistors 301, 303, 305, 307 and nodes A and B respectively set to ground and INP). For a design such as that shown in FIG. 4 which treats the highest bit (or bits) as for a9, an intermediate input INM corresponding to node Y could again be provided from a second op-amp as in FIG. 4.

Also connected between INP and ground in parallel with the DAC 601 is a variable resistance $R_{variable}$ 603. The variable resistance $R_{variable}$ 603 would also receive the digital input values a0-a(N−1) (and typically any intermediate voltage levels, such as INM, used by DAC 601 to establish DAC_OUT). From these inputs, the value of the variable resistance $R_{variable}$ is set so that the current through $R_{variable}$ is the complement of current through the R-2R DAC circuit. By adding $R_{variable}$ so that sum of the current though DAC 601 and $R_{variable}$ 603 (~[1/$R_{R-2R}$+1/$R_{variable}$]) is fixed (or at least essentially or relatively so over the range of digital input values), $I_{load}$ becomes independent (or, again, largely independent) of the digital input value for R-2R DAC 601, and so a fixed load current for the Op-amp 1 611. For example, $R_{variable}$ could be of a similar structure to DAC 601, but with the inputs inverted, so that in the exemplary R-2R embodiment it could also be structured as a resistor ladder, but with connections to ground and $V_{ref}$ in FIG. 4 switched for each of the digital inputs. In alternate embodiments, such compensation may be done for only the highest bits if this provides sufficient accuracy. As a consequence, the open loop gain of Op-amp1 611 will not change as a function of the input values for the DAC change. Consequently, the level INP will not vary and the error term on DAC linearity due to op-amp open loop gain from load current variation is essentially removed.

As noted in the Background, DAC circuits are typically implemented as peripheral elements on larger circuits. The improvements in accuracy from the arrangement present above could be beneficially employed to supply the various levels used in the operation of multi-state non-volatile memories. Examples of such memories and some of the voltage levels used in their operation are presented in US patent application publication number US-2008-0019188-A. Additionally, although the description above was based on an R-2R type of DAC circuitry such as shown in FIG. 4 or 1a, the techniques presented here can also be used to reduce or eliminate error due to op-amp gain variation in other types of DAC circuits arranged as with circuit 601 of FIG. 6.

Although the invention has been described with reference to particular embodiments, the description is only an example of the invention's application and should not be taken as a limitation. Consequently, various adaptations and combinations of features of the embodiments disclosed are within the scope of the invention as encompassed by the following claims.

It is claimed:

1. A circuit for generating an analog voltage from a digital input value, comprising:

an op-amp connected to receive a reference voltage and provide an input voltage generated therefrom to a first node;

an digital to analog conversion circuit connected between the first node and ground and to receive an N-bit digital input value and generate therefrom an analog voltage; and a variable resistance connected between the first node and ground in parallel with the digital to analog conversion circuit and connected to receive one or more of the digital input value, the value of the variable resistance being dependent upon the one or more digital input value such that the combined current drawn from the first node by the variable resistance and the digital to analog conversion circuit is essentially constant during operation.

2. The circuit of claim 1, further comprising:

a transistor connected between a supply level and the first node, where the output of the op-amp is connected to the control gate of the transistor; and a voltage divider circuit connected in series between the first node and ground, where the reference voltage is connected to a first input of the op-amp and where a second input of the op-amp is connected to receive feedback from a second node of the voltage divider circuit.

3. The circuit of claim 2, wherein the voltage divider circuit includes a plurality of resistances connected in series between the first node and ground, where the second node is between two of the plurality on resistances connected in series.

4. The circuit of claim 1, wherein the digital to analog conversion circuit and the variable resistance are further connected to receive an intermediate input voltage from a third node of the voltage divider circuit.

5. The circuit of claim 1, wherein the digital to analog conversion circuit has a R-2R circuit structure.

6. The circuit of claim 1, where the variable resistance has a circuit structure similar to that of digital to analog conversion circuit, wherein one or more of the bits of the digital input received at the variable resistance are inverted for use in the variable resistance.

7. A method of generating an analog voltage from a digital input value, comprising:

receiving at an op-amp a reference voltage and generating therefrom an input voltage to a node;

receiving an N-bit digital input value at an digital to analog conversion circuit connected between the node and ground;

generating in the digital to analog converter as analog voltage value corresponding to the received N-bit digital input value; and receiving one or more of the digital input value at a variable resistance connected between the node and ground in parallel with the digital to analog conversion circuit, wherein the value of the variable resistance is dependent upon the one or more digital input value such that the combined current drawn from the node by the variable resistance and the digital to analog conversion circuit is essentially constant during operation.

8. The method of claim 7, further comprising:

providing the output of the op-amp to the control gate of a transistor connected between a supply level and the first node; and receiving at a second input of the op-amp feedback from a second node of a voltage divider circuit connected in series between the first node and ground, wherein the reference voltage is connected to a first input of the op-amp.

9. The method of claim 8, wherein the voltage divider circuit includes a plurality of resistances connected in series between the first node and ground, where the second node is between two of the plurality on resistances connected in series.

10. The method of claim 7, further comprising:

receiving at the digital to analog conversion circuit and at the variable resistance an intermediate input voltage from a third node of the voltage divider circuit.

11. The method of claim 7, wherein the digital to analog conversion circuit has a R-2R circuit structure.

12. The method of claim 7, where the variable resistance has a circuit structure similar to that of digital to analog conversion circuit, wherein one or more of the bits of the digital input received at the variable resistance are inverted for use in the variable resistance.

* * * * *